United States Patent
Hikita et al.

(10) Patent No.: US 7,589,415 B2
(45) Date of Patent: Sep. 15, 2009

(54) SEMICONDUCTOR CHIP AND SEMICONDUCTOR DEVICE USING THE SAME, AND METHOD OF FABRICATING SEMICONDUCTOR CHIP

(75) Inventors: Junichi Hikita, Kyoto (JP); Kazutaka Shibata, Kyoto (JP); Shigeyuki Ueda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 575 days.

(21) Appl. No.: 10/119,936

(22) Filed: Apr. 11, 2002

(65) Prior Publication Data

US 2002/0109133 A1 Aug. 15, 2002

Related U.S. Application Data

(62) Division of application No. 09/511,106, filed on Feb. 23, 2000, now Pat. No. 6,391,685.

(30) Foreign Application Priority Data

Feb. 23, 1999 (JP) .................................. 11-045215

(51) Int. Cl.
*H01L 23/04* (2006.01)
(52) U.S. Cl. ................. 257/698; 257/E23.141
(58) Field of Classification Search ................. 257/686, 257/692, 698, 723, 774, 777; 438/107–109
See application file for complete search history.

(56) References Cited

U.S. PATENT DOCUMENTS

| | | | | |
|---|---|---|---|---|
| 4,499,655 A | * | 2/1985 | Anthony | 438/109 |
| 4,930,216 A | | 6/1990 | Nelson | 29/854 |
| 4,984,358 A | | 1/1991 | Nelson | 438/109 |
| 5,399,898 A | * | 3/1995 | Rostoker | 257/499 |
| 5,432,999 A | * | 7/1995 | Capps et al. | 438/109 |
| 5,585,675 A | * | 12/1996 | Knopf | 257/774 |
| 5,795,815 A | * | 8/1998 | Vokoun et al. | 438/462 |
| 6,002,177 A | * | 12/1999 | Gaynes et al. | 257/774 |
| 6,122,187 A | * | 9/2000 | Ahn et al. | 365/63 |
| 6,222,276 B1 | * | 4/2001 | Bertin et al. | 257/778 |
| 6,271,598 B1 | * | 8/2001 | Vindasius et al. | 257/777 |

(Continued)

FOREIGN PATENT DOCUMENTS

JP 3-205846 9/1991

(Continued)

OTHER PUBLICATIONS

Jaeger, Richard, "Modular series on Solid State Devices: vol. V, Introduction to Microelectronic Fabrication" Addison-Wesley Publishing Company, May 1993, p. 154.*

*Primary Examiner*—David S. Blum
(74) *Attorney, Agent, or Firm*—Rabin & Berdo, P.C.

(57) ABSTRACT

A semiconductor chip in which a through hole penetrating through its surface and reverse surface is formed in a scribe line region in the vicinity of an active region where a functional device is formed, and a conductive member is arranged in the through portion. The through portion may be a groove opening sideward on a sidewall surface of the semiconductor chip. The through portion may be a through hole blocked from a side part of the semiconductor chip. The semiconductor chip may further include wiring for electrically connecting an internal circuit formed in the active region and the conductive member to each other.

2 Claims, 7 Drawing Sheets

U.S. PATENT DOCUMENTS

| | | |
|---|---|---|
| 6,355,981 B1 * | 3/2002 | Richards et al. ............. 257/735 |
| 6,395,630 B2 * | 5/2002 | Ahn et al. ................... 438/667 |
| 6,400,008 B1 * | 6/2002 | Farnworth .................. 257/698 |

FOREIGN PATENT DOCUMENTS

| | | |
|---|---|---|
| JP | 4-335552 A | 11/1992 |
| JP | 5-129430 | 5/1993 |
| JP | 08-306724 | 11/1996 |
| JP | 10-22236 | 1/1998 |
| JP | 10-223833 | 8/1998 |

* cited by examiner

F I G. 2
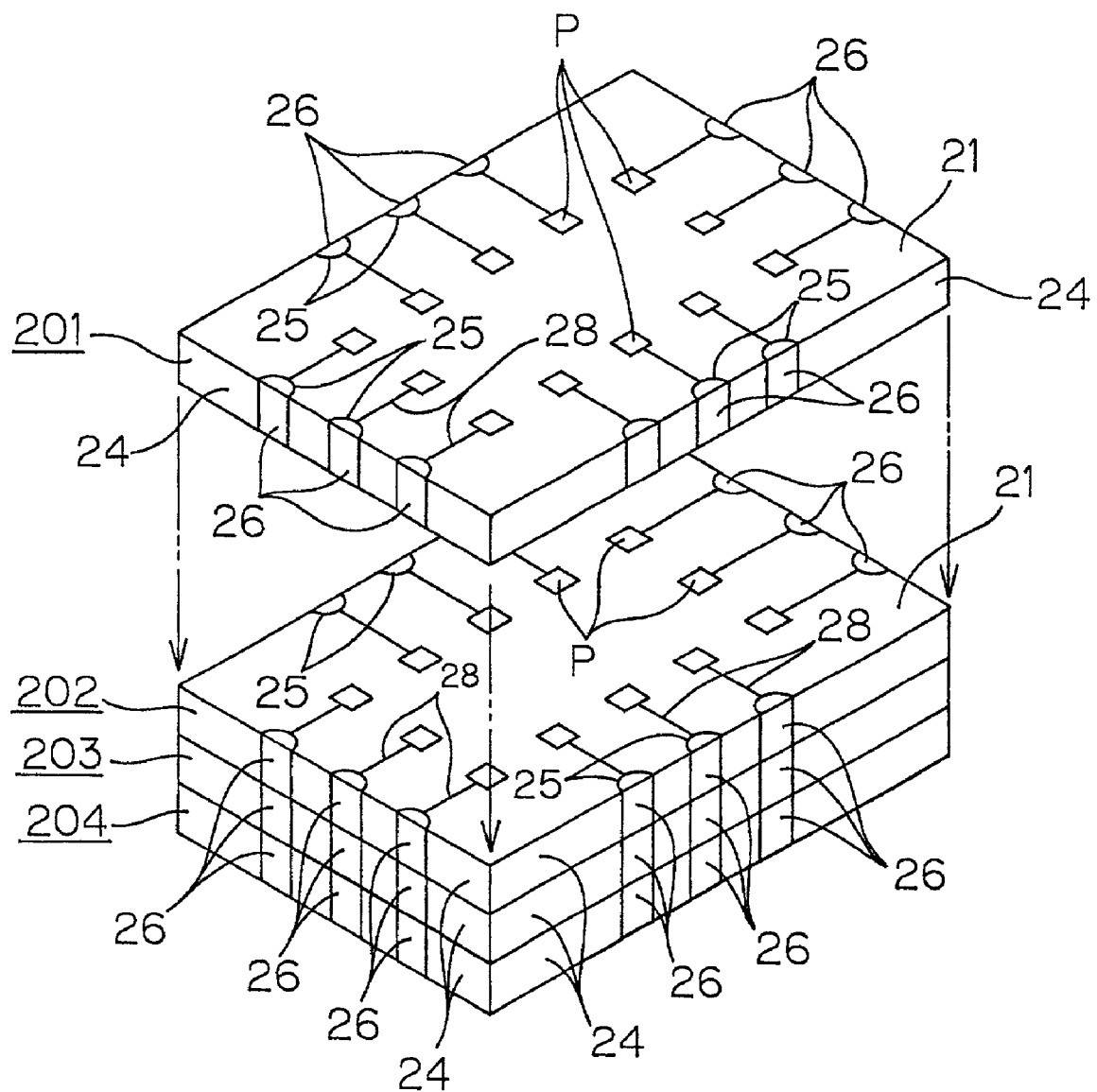

F I G. 3
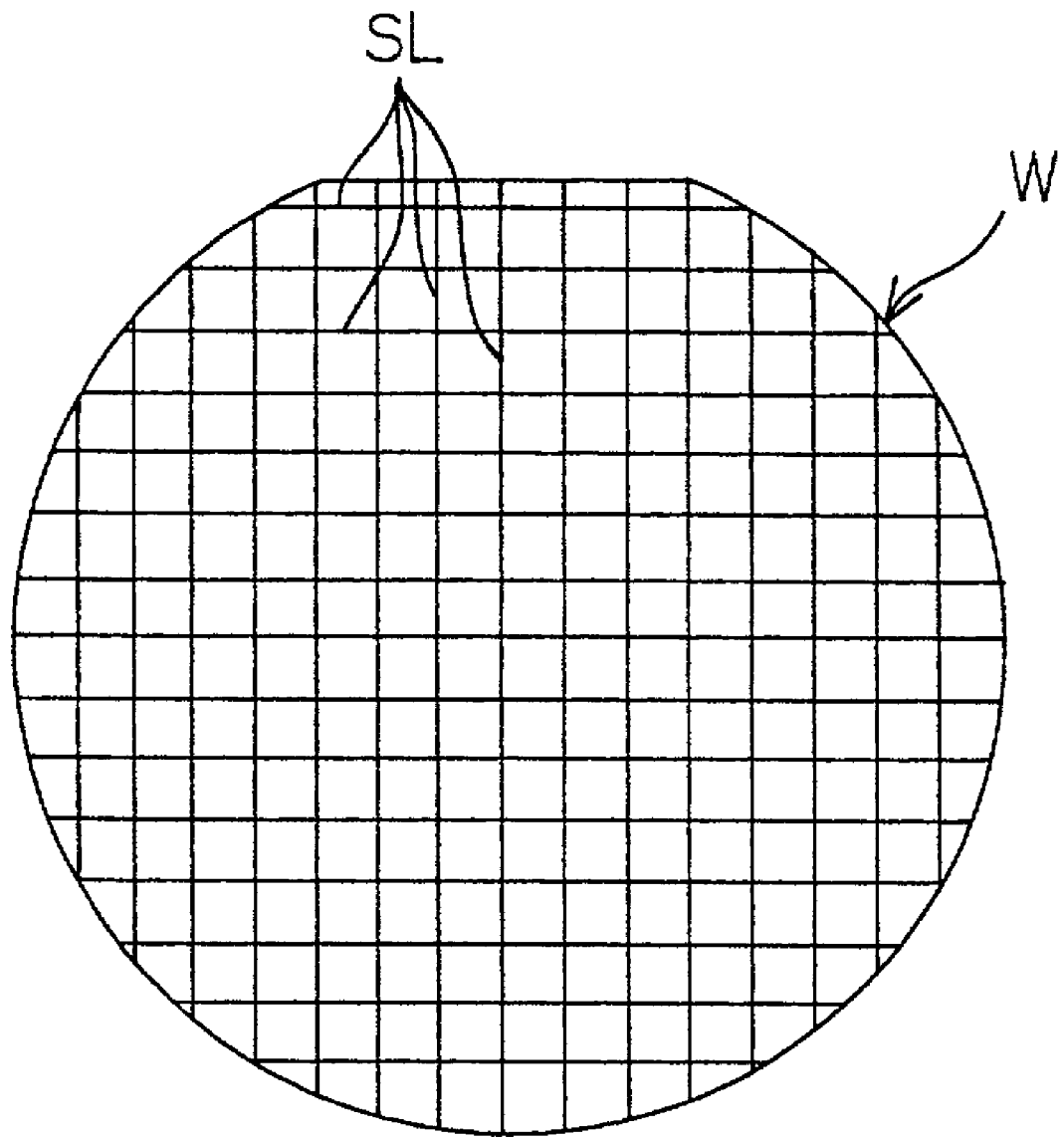

SEMICONDUCTOR CHIP AND SEMICONDUCTOR DEVICE USING THE SAME, AND METHOD OF FABRICATING SEMICONDUCTOR CHIP

CROSS-REFERENCE TO RELATED APPLICATION

This is a division of application Ser. No. 09/511,106, filed Feb. 23, 2000 (now U.S. Pat. No. 6,391,665).

BACKGROUND OF THE INVENTION

1. Field of the Invention

The present invention relates to a semiconductor chip to be electrically connected to a solid device and a semiconductor device using the same, and a method of fabricating the semiconductor chip.

2. Description of Related Art

In a case where a semiconductor chip is mounted on a printed wiring board by flip-chip 15 bonding or a case where semiconductor chips are joined to each other by overlapping one of the semiconductor chips with the other semiconductor chip to construct a semiconductor device having a chip-on-chip structure, a face-down mounting system or a face-up mounting system is applicable, for example. The face-down system is a mounting system in which the surface of a semiconductor chip is opposed to the surface of a printed wiring board or another semiconductor chip. Contrary to this, the face-up system is a mounting system in which the reverse surface of a semiconductor chip is opposed to the surface of a printed wiring board or another semiconductor chip. The surface of the semiconductor chip is a surface on the side of an active surface layer region where a functional device is formed on a semiconductor substrate forming a base body, and a surface opposite thereto is the reverse surface.

In a case where the face-down system is used, a metal electrode portion called a bump is formed in a raised state on the surface of the semiconductor chip. The bump is joined to a connecting pad formed on the surface of the printed wiring board or the other semiconductor chip.

In a case where the face-up system is used, a connecting pad on the surface of the semiconductor chip and a connecting pad on the surface of the printed wiring board or the other semiconductor chip are connected to each other by wire bonding.

In the case where the face-down system is used, the surface of the semiconductor chip is opposite to the printed wiring board or the other semiconductor chip as a base chip. Accordingly, it is impossible to take a structure in which three or more semiconductor chips are stacked by further joining to the semiconductor chip another semiconductor chip. Therefore, there is a limit to an improvement in an integration degree.

In the case where the face-up system is used, in the printed wiring board or the base semiconductor chip, a connecting pad must be provided outside the region where the semiconductor chip is stacked and joined thereto, for convenience of wire bonding. Therefore, the overall occupied area is considerably large, thereby preventing the integration degree from being improved.

SUMMARY OF THE INVENTION

An object of the present invention is to provide a semiconductor chip capable of improving an integration degree and a semiconductor device using the same.

Another object of the present invention is to provide a method of fabricating a semiconductor chip capable of improving an integration degree.

In a semiconductor chip according to the present invention, a through portion penetrating through the surface and the reverse surface of the semiconductor chip is formed in a scribe line region in the vicinity of an active region where a functional device is formed, and a conductive member is arranged in the through portion.

The active region is a region where a functional device such as a transistor, a resistor, or a capacitor, internal wiring appended thereto, and so forth are formed. Contrary to this, the scribe line region is a region in the vicinity of a scribe line which is a cut line in a case where each chip is diced from a large semiconductor substrate (wafer).

According to the above-mentioned construction, the through portion is formed in the scribe line region, and the conductive member is arranged in the through portion. Consequently, the scribe line region is utilized, thereby making it possible to pull out a connecting end of a terminal provided on the surface of the semiconductor chip toward the reverse surface of the semiconductor chip without increasing the size of the semiconductor chip.

Even when the semiconductor chip is joined to another solid device (for example, a printed wiring board or another semiconductor chip) by a face-down system, therefore, another semiconductor chip can be overlapped with and joined to the reverse surface of the semiconductor chip. Consequently, it is possible to increase the integration degree of the semiconductor device using the semiconductor chip.

When the semiconductor chip is joined to another solid device by a face-up system, the conductive member arranged in the through portion is connected to a connecting portion (a bump or a connecting pad) in the solid device on the reverse surface of the semiconductor chip, thereby making it possible to achieve electrical connection between the semiconductor chip and the solid device. Consequently, the solid device forming a base need not have a large area as in the case of connection by wire bonding. Therefore, it is possible to increase the integration degree of the semiconductor device using the semiconductor chip.

The conductive member may be a conductive paste, or a metal layer such as a plating layer formed on an innerwall surface of the through portion.

The through portion may be a groove opening sideward on a sidewall surface of the semiconductor chips The through portion may be a through hole blocked from a side part of the semiconductor chip.

Furthermore, an internal circuit formed in the active region and the conductive member may be electrically connected to each other by wiring, thereby making it possible to make electrical connection to the internal circuit on the reverse surface of the semiconductor chip.

The semiconductor device according to the present invention comprises a semiconductor chip constructed as described above, and a solid device having a connecting portion joined to the conductive member on the-reverse surface, which is a surface opposite to an active surface layer side surface of the semiconductor chip.

By the construction, the above-mentioned effect can be achieved in a semiconductor device having a structure in which a semiconductor chip and another solid device (a printed wiring board, another semiconductor chip, or the like) are stacked.

A method of fabricating a semiconductor chip according to the present invention is a method of fabricating a semiconductor chip by cutting a semiconductor substrate along a scribe line which comprises the steps of forming a through hole penetrating through the surface and the reverse surface of the semiconductor substrate in a scribe line region that is a region in the vicinity of the scribe line on the semiconductor substrate; and arranging a conductive member in the through hole.

By this method, it is possible to fabricate the semiconductor chip constructed as described above through relatively easy steps.

The step of forming the through hole may comprise the step of forming a recess having such a depth that it does not penetrate through the whole thickness of the semiconductor substrate from the surface of the semiconductor substrate, and the step of grinding the semiconductor substrate from the reverse surface of the semiconductor substrate so that the hole communicates with a space on the reverse surface of the semiconductor substrate. Consequently, it is possible to shorten the step of opening the semiconductor substrate (for example, the etching step).

The through hole may be formed on the scribe line.

The through hole may be formed in a position avoiding the scribe line.

In order to reduce the number of through holes to be formed, it is preferable to form the through holes on the scribe line. Consequently, it is possible to shorten a time period required for the steps.

The step of forming the through hole may comprise the step of forming a resist film having an opening corresponding to the position where the through hole is formed on the surface of the semiconductor substrate and the step of etching the semiconductor substrate using the resist film as a mask. In this case, the step of arranging the conductive member in the through hole may comprise the step of arranging the conductive member in the through hole using the resist film as a mask.

In this method, the resist film for forming the through hole in the semiconductor substrate can be also utilized for an arrangement of the conductive member in the through hole. Consequently, it is possible to simplify the steps of fabricating the semiconductor chip.

The arrangement of the conductive member in the through hole may be made by selectively plating an innerwall surface of the through hole with a metal.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 illustrates an example in which a multichip type semiconductor device is constructed by stacking a plurality of semiconductor chips;

FIG. 3 is a plan view showing a scribe line on a semiconductor wafer;

DESCRIPTION OF THE PREFERRED EMBODIMENTS

Figure 1:
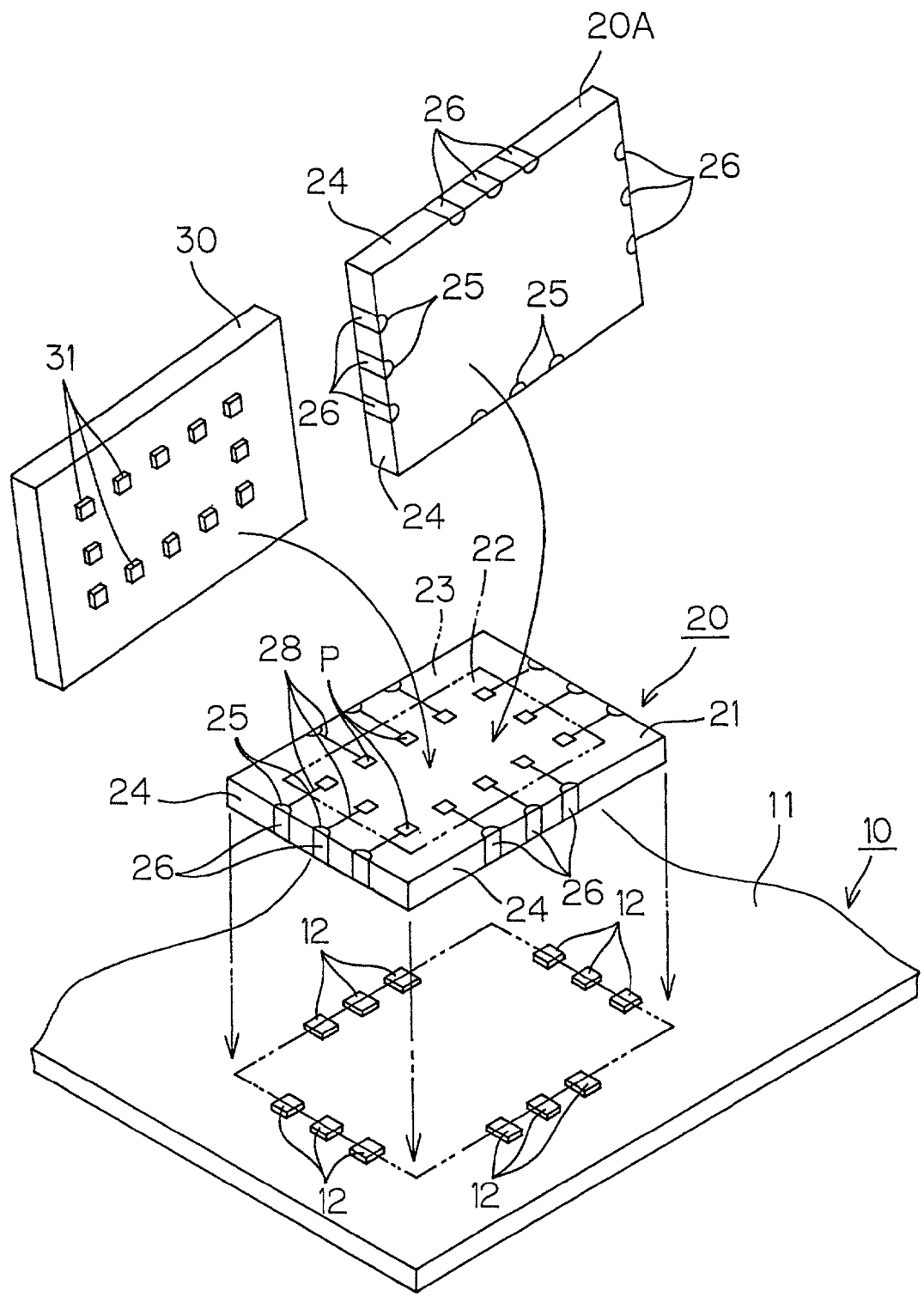
FIG. 1 is an exploded perspective view showing the construction of a semiconductor device according to an embodiment of the present invention.

FIG. 1 is an exploded perspective view showing the construction of a semiconductor device according to an embodiment of the present invention. The semiconductor device has a printed wiring board 10 and a semiconductor chip 20 electrically connected to the printed wiring board 10 by flip-chip bonding. The semiconductor chip 20 is joined to the printed wiring board 10 by a so-called face-up system with its surface 21 and a surface 11 of the printed wiring board 10 directed in opposite directions in the present embodiment.

The surface 21 of the semiconductor chip 20 is a surface on the side of an active surface layer region where a functional device such as a transistor or a resistor is formed. On the surface 21, a connecting pad P connected to an internal circuit is exposed in a suitable position inside an active region 22 which is a region, where the functional device is formed, in the vicinity of the center thereof.

A region outside the active region 22 is a scribe line region 23 in the vicinity of a scribe line in a case where each semiconductor chip 20 is cut down from a semiconductor wafer. In the scribe line region 23, a plurality of grooves 25 which form a through portion penetrating through the surface and the reverse surface of the semiconductor chip 20. The groove 25 opens sideward on a sidewall surface 24 of the semiconductor chip 20. A conductive paste 26 such as a cream solder or a silver paste is arranged inside the groove 25.

Surface wiring 28 for connecting the conductive paste 26 within each of the grooves 25 and the connecting pad P is formed on the surface 21 of the semiconductor chip 20. It is preferable that the surface wiring 28 is formed of an oxidation-resistant metal, for example, gold, palladium, titanium, silver, or iridium.

On the other hand, a plurality of solder bumps 12 (connecting portions) are formed in positions, corresponding to the sidewall surface 24 of the semiconductor chip 20, on the surface 11 of the printed wiring board 10. The semiconductor chip 20 is fixed to the printed wiring board 10 with adhesives, for example, in a state where the plurality of grooves 25 and the plurality of solder bumps 12 are aligned with each other. The assembly of the semiconductor chip 20 and the printed wiring board 10 is then subjected to reflow processing, so that the conductive paste 26 and the solder bump 12 are welded on each other. Consequently, electrical. and mechanical connection between the semiconductor chip 20 and the printed wiring board 10 is achieved.

It is possible to thus make connection in a face-up system without using a bonding wire. Consequently, the printed wiring board 10 need not have a large area, thereby making it possible to miniaturize the semiconductor device. Moreover, connection to the printed wiring board 10 is achieved in the scribe line region 23, so that the semiconductor chip 20 is not made larger, as compared with a conventional chip. Accordingly, the integration degree of the semiconductor device can be improved.

On the other hand, the surface 21 of the semiconductor chip 20 on the printed wiring board 10 is directed upward (in the opposite direction to the printed wiring board 10). On the surface 21, a semiconductor chip 30 of normal construction can be mounted, and a semiconductor chip 20A of the similar construction to that of the semiconductor chip 20 can be also mounted.

The semiconductor chip 30 of the normal construction has a bump 31 in a position corresponding to the connecting pad P formed on the surface 21 of the semiconductor chip 20. The bump 31 is pressed against the connecting pad P, thereby making it possible to overlap and join the semiconductor chip 30 with and to the surface 21 of the semiconductor chip 20 by a so-called face-down system.

When the semiconductor chip 20A of the similar construction to that of the semiconductor chip 20 is jointed thereto, electrical and mechanical connection between the semiconductor chips 20 and 20A can be achieved if conductive pastes 26 arranged in grooves 25 on sidewall surfaces 24 of the semiconductor chips 20 and 20A are welded on each other by reflow processing.

An innerwall surface of the groove 25 may be plated with a metal instead of arranging the conductive paste 26 in the groove 25. The metal used in this case is preferably an oxidation-resistant metal, for example, gold, palladium, titanium, silver, or iridium. A metal material with which the innerwall surface of the groove 25 is plated may be composed of the same material as that of the surface wiring 28. Consequently, the arrangement of the conductive member on the innerwall surface of the groove 25 and the formation of the surface wiring 28 can be performed in the same step, thereby making it possible to simplify the steps of fabricating the semiconductor chip 20.

FIG. 2 illustrates an example in which a lot of semiconductor chips 201, 202, 203, and 204 of the similar construction to that of the semiconductor chip 20 are stacked, to construct a multichip type semiconductor device. That is, the semiconductor chip 201 is joined to the surface of the semiconductor chip 202 by a face-up system. The semiconductor chip 202 is joined to the surface of the semiconductor chip 203 by a face-up system. The semiconductor chip 203 is joined to the surface of the semiconductor chip 204 by a face-up system. Similarly, it is possible to stack a desired number of semiconductor chips. Connection among the semiconductor chips 201 through 204 is achieved by a conductive paste 26 formed on a sidewall surface 24. In FIG. 2, the same reference numerals as those assigned to the corresponding portions in the semiconductor chip 20 shown in FIG. 1 are assigned to respective portions of the semiconductor chips 201-204.

When the plurality of semiconductor chips are stacked, the normal semiconductor chip 30 shown in FIG. 1 may be used as the uppermost semiconductor chip, and the semiconductor chip 30 may be joined to the surface of the semiconductor chip just below the semiconductor chip 30 by a face-down system.

Figure 4:
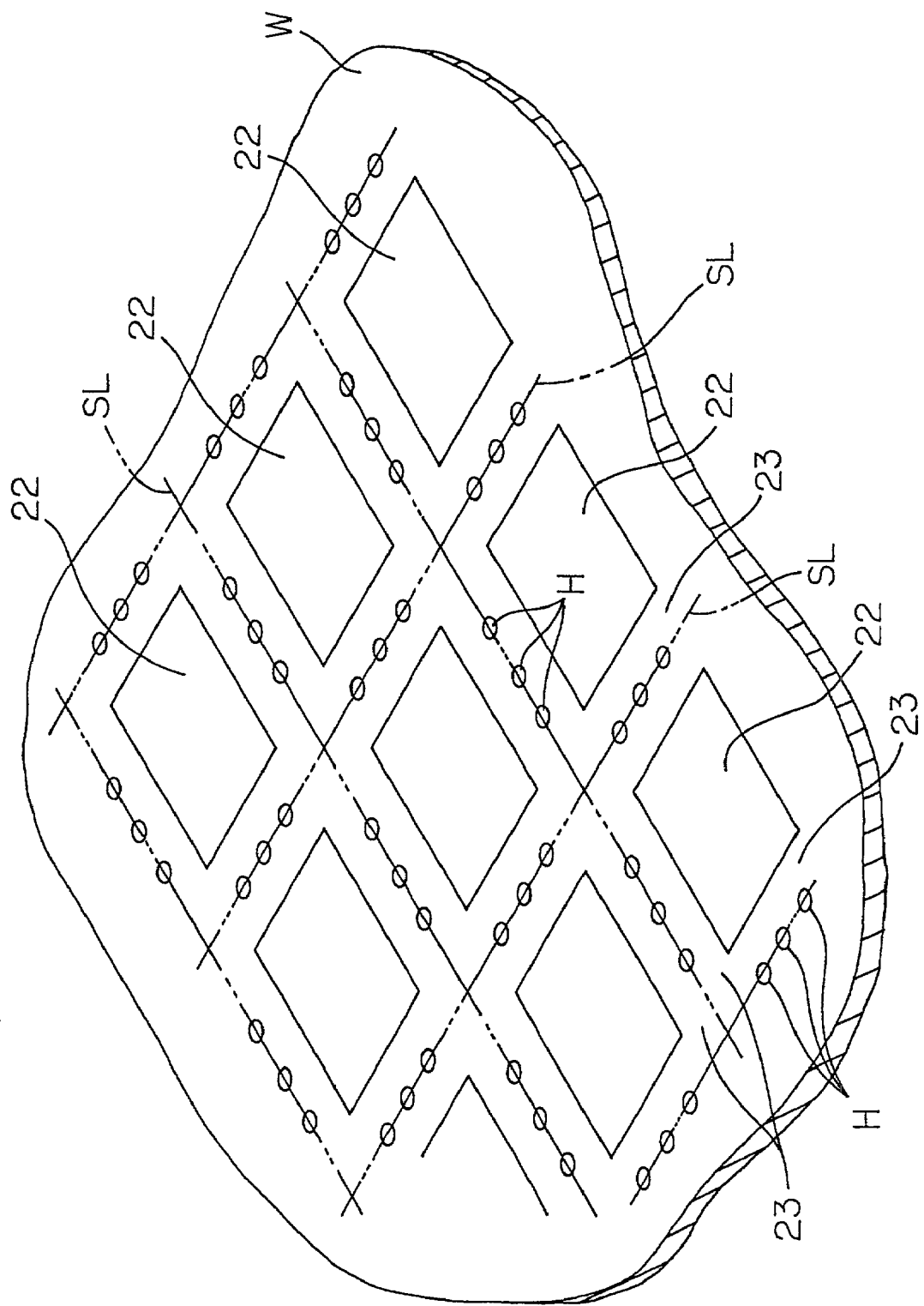
FIG. 4 is a partially enlarged perspective view showing construction in the vicinity of a scribe line on a semiconductor wafer.

FIGS. 3 and 4 are diagrams for explaining the steps of fabricating the semiconductor chip 20. The semiconductor chip 20 is produced upon being cut down by dicing a semiconductor wafer W along scribe lines SL. Prior to the dicing, a functional device, internal wiring, and so forth are formed in an active region 22. Thereafter, through holes H penetrating through the surface and the reverse surface of the wafer W are formed on the scribe lines SL, as shown in FIG. 4.

Figure 5A:
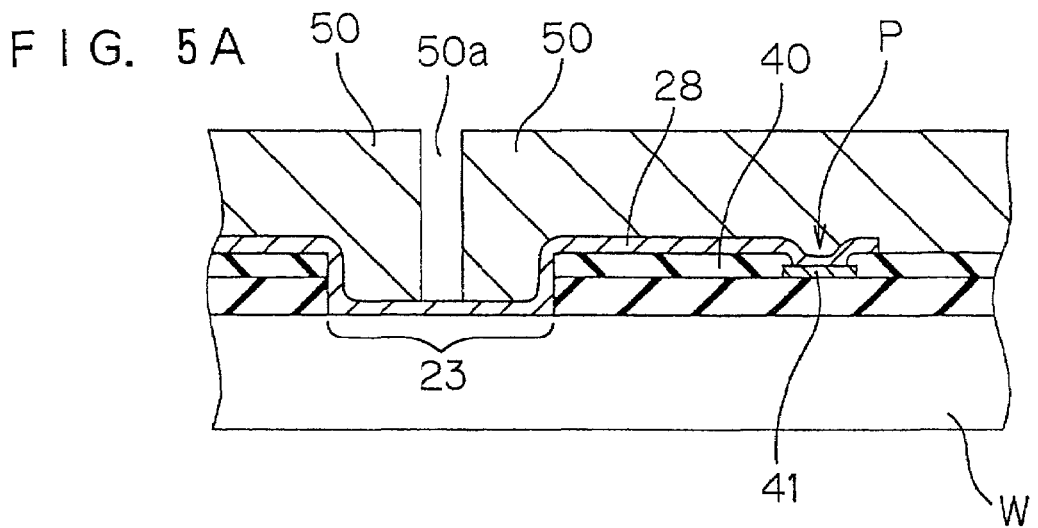
FIGS. 5A, 5B and 5C are cross-sectional views showing construction for forming a groove on a sidewall surface of a semiconductor chip.

The through hole H is formed in the semiconductor wafer W in a state where surface wiring 28 is formed, as shown in FIG. 5A. The surface wiring 28 is connected to internal wiring 41 (a connecting pad P) such as aluminum wiring and extends to a scribe line region 23 on a surface protective film 40. The surface wiring 28 extends to the position where the through hole H is formed. The pattern of a resist film 50 having an opening 50a corresponding to the through hole H is formed on the semiconductor wafer W. The surface wiring 28 and the semiconductor wafer W are etched using the resist film 50 as a mask, thereby forming the through hole H.

Figure 5B:
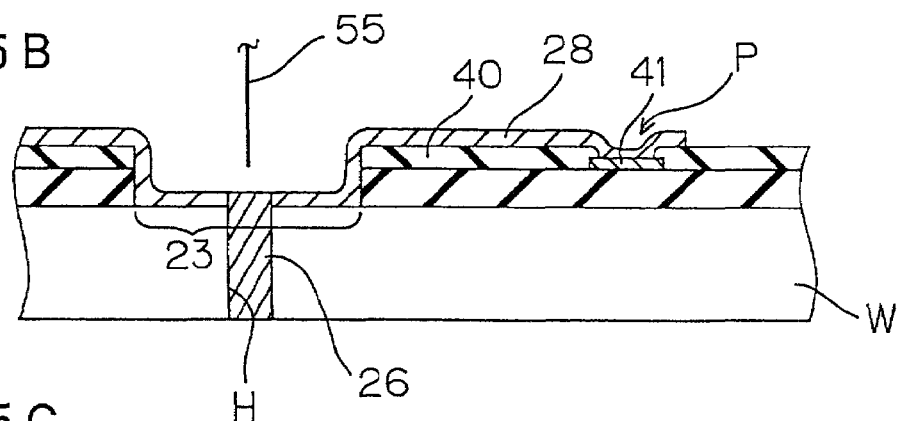
Figure 5C:
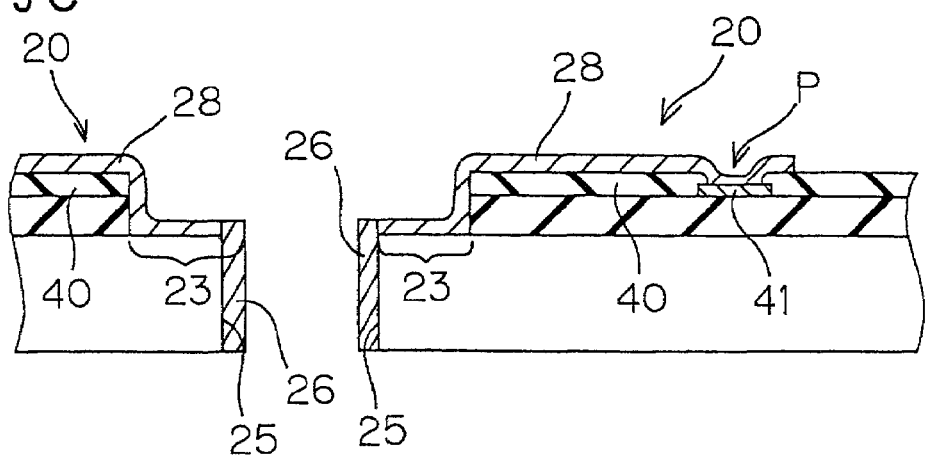

Thereafter, a conductive paste 26 is embedded in the through hole H such that it is connected to the surface wiring 28, and then the resist film 50 is striped away, as shown in FIG. 5B. The semiconductor wafer W is then cut along the scribe line SL by a dicing saw 55, so that a semiconductor chip 20 having a groove 25 on its sidewall surface is obtained, as shown in FIG. 5C.

When an innerwall surface of the groove 25 is plated with a metal instead of using the conductive paste 26, it is preferable that the resist film 50 is further used as a mask from a state where the through hole H is formed, and a plating layer is formed on an innerwall surface of the through hole H by electroless plating. Consequently, it is possible to simplify the fabricating steps.

Figure 6A:
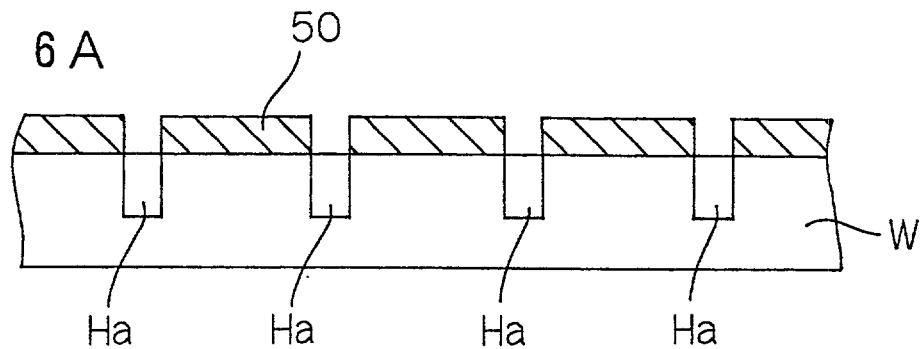
FIGS. 6A and 6B are cross-sectional views showing an example of a method of forming a through hole in a semiconductor wafer.
Figure 6B:
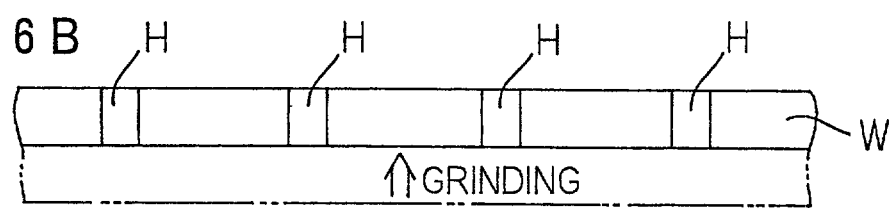

Although the through hole H may be formed by etching over the whole thickness of the semiconductor wafer W, it can be also formed by etching the semiconductor wafer W to such a depth that it does not reach the bottom of the semiconductor wafer W to form a recess Ha, and then grinding the reverse surface of the semiconductor wafer W so that the recess Ha penetrates through the reverse surface of the semiconductor waver W, as shown in FIGS. 6A and 6B.

Figure 7:
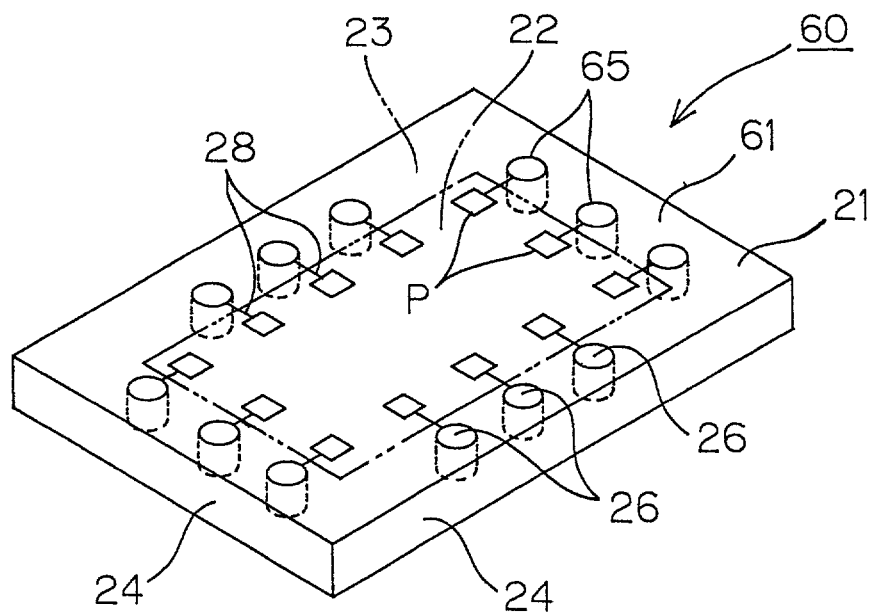
FIG. 7 is a perspective view showing the construction of a semiconductor chip according to a second embodiment of the present invention.

FIG. 7 is a perspective view showing the construction of a semiconductor chip according to a second embodiment of the present invention. A semiconductor chip 60 according to the second embodiment has construction similar to that of the semiconductor chip according to the first embodiment and hence, portions corresponding to the portions shown in FIG. 1 are assigned the same reference numerals. FIG. 1 will be referred to again.

A plurality of through holes 65 are formed in an inner part of a scribe line SL (near an active region) in a scribe line region 23. A conductive paste 26 is embedded in each of the through holes 65. The conductive paste 26 and a connecting pad P are connected to each other by surface wiring 28.

The semiconductor chip 60 of such construction can be mounted on the surface 11 of the printed wiring board 10 by a face-up system, similarly to the semiconductor chip 20 according to the first embodiment. In this case, the through hole 65 and a solder bump 12 on the surface 11 of the printed wiring board 10 are aligned with each other, whereby the connecting pad P and the solder bump 12 can be electrically connected to each other through the conductive paste 26 inside the through hole 65.

A plurality of semiconductor chips of the similar construction to that of the semiconductor chip 60 can be also stacked, as in the case shown in FIG. 2.

Furthermore, the semiconductor chip 30 of the normal construction (see FIG. 1) can be joined to a surface 61 of the semiconductor chip 60 by a face-down system.

Figure 8:
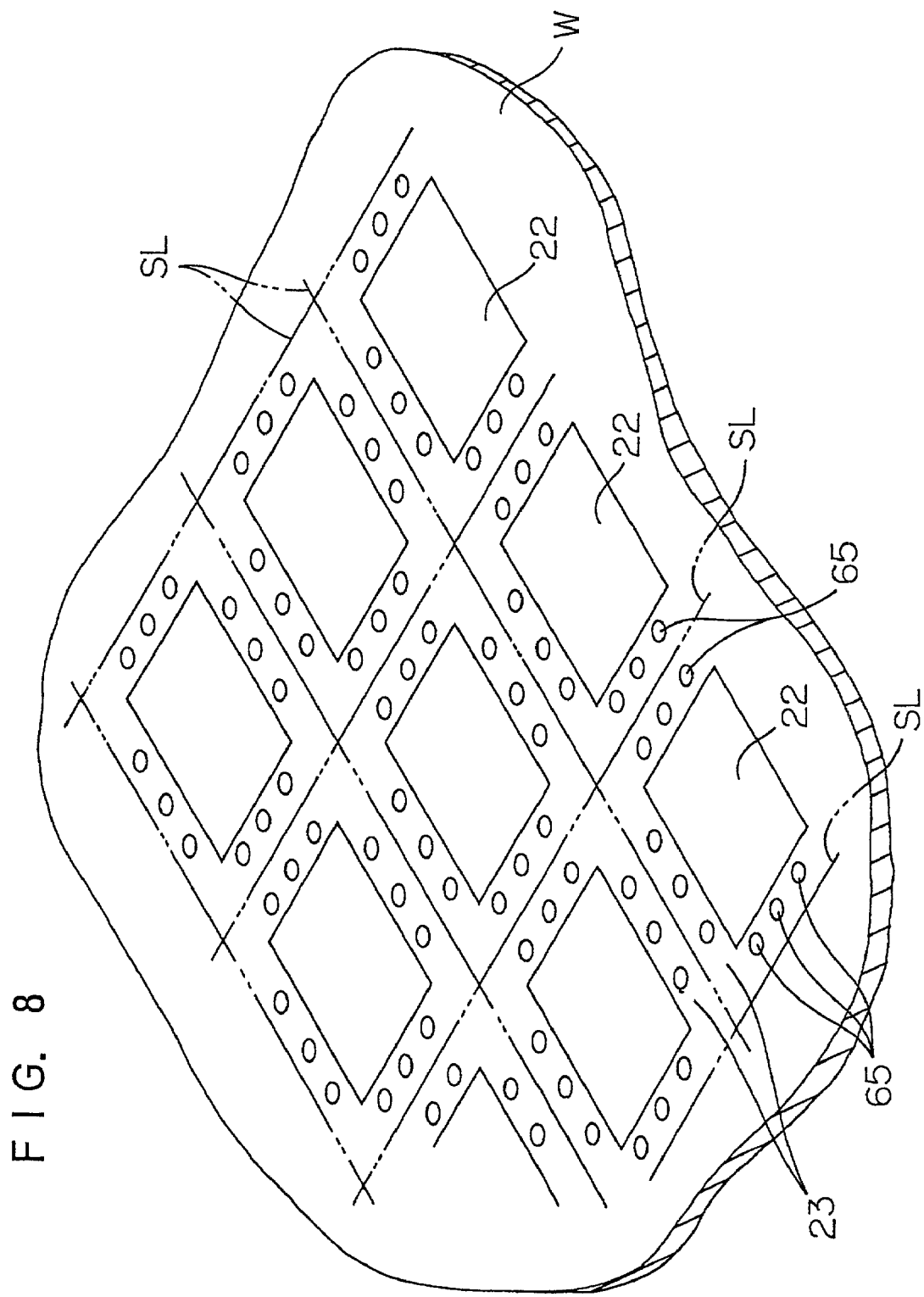
FIG. 8 is a partially enlarged perspective view showing construction in the vicinity of a scribe line on a semiconductor wafer in a case where the semiconductor chip according to the second embodiment is formed.

FIG. 8 is a perspective view for explaining a method of fabricating the semiconductor chip 60, which illustrates a state before cutting down the semiconductor chip 60 from the semiconductor wafer W. That is, a plurality of through holes 65 are formed on both sides of scribe lines SL along the scribe lines SL, and a conductive paste is arranged inside each of the through hole 65. In this state, the semiconductor wafer W is diced along the scribe line SL, thereby obtaining the semiconductor chips 60.

The through hole 65 can be formed in the same manner as the formation of the through hole H in the first embodiment. A metal plating layer may be formed on an innerwall surface of the through hole 65, as in the first embodiment, instead of arranging the conductive paste 26.

Description has been made of the two embodiments of the present invention, the present invention can be also embodied even in another form. Although in the first and second embodiments, description has been made of a case where the semiconductor chip 20 or 60 is jointed to the printed wiring board 10 or the other semiconductor chip by the face-up system, it will be immediately understood that it can be joined by a face-down system. When the semiconductor chip is joined by the face-down system, it may be joined by forming a bump on a connecting pad P and pressing the bump against a connecting pad on the surface of a solid device (a printed wiring board or a semiconductor chip) below the bump. It goes without saying that the conductive paste 26 arranged in the groove 25 or the through hole 65 can be also utilized for connection to the printed wiring board 10 or the other semiconductor chip, as in the case of the joining by the face-up system.

Also in the case of the joining by the face-down system, the conductive paste 26 inside the groove 25 or the through hole 65 is used for electrical connection on the reverse surface of the semiconductor chip 20 or 60, thereby making it possible to further stack and connect another semiconductor chip.

An arbitrary semiconductor material including a silicon semiconductor, a germanium semiconductor or a compound semiconductor (a gallium arsenic semiconductor) can be applied to a semiconductor material composing the semiconductor chip.

Although the present invention has been described and illustrated in detail, it is clearly understood that the same is by way of illustration and example only and is not to be taken by way of limitation, the spirit and scope of the present invention being limited only by the terms of the appended claims.

The present invention claims priority benefits under 35 USC § 119 of Japanese Patent Application No. 11-45215 filed with the Japanese Patent Office on Feb. 23, 1999.

What is claimed is:

1. A semiconductor chip, wherein
   a through portion penetrating through a front surface and a reverse surface of the semiconductor chip is formed in a scribe line region in the vicinity of an active region at the front surface where a functional device is formed, the active region being covered by a surface protective film and the through portion penetrating the front surface of the semiconductor chip at a location spaced apart from the surface protective film;
   a conductive member is arranged in the through portion, and
   wiring is provided for electrically connecting the functional device formed in the active region to the conductive member arranged in the through portion, the wiring extending over an outer edge of the surface protective film before reaching the conductive member so as to provide a step in the wiring,
   wherein the through portion is a through hole that is spaced apart from a side part of the semiconductor chip.

2. The semiconductor chip according to claim 1, wherein the semiconductor chip comprises a semiconductor substrate, and a portion of the wiring on the front surface of the semiconductor chip is in direct contact with the substrate in the scribe line region.

* * * * *